United States Patent [19]

Greenbaum

[11] Patent Number: 5,734,866

[45] Date of Patent: Mar. 31, 1998

[54] SET OF FUNCTIONS FOR MAPPING INTO CELL BASED INTEGRATED CIRCUITS WITH FIXED NUMBER OF INPUTS

[76] Inventor: Jack E. Greenbaum, 12590 Paseo Cerro, Saratoga, Calif. 95070

[21] Appl. No.: 503,798

[22] Filed: Jul. 18, 1995

[51] Int. Cl.$^6$ .................................................. G06F 9/455
[52] U.S. Cl. ........................... 395/500; 364/578; 364/488; 364/489
[58] Field of Search ........................... 395/500; 364/488, 364/489, 490, 578

[56] References Cited

U.S. PATENT DOCUMENTS

| | | | |
|---|---|---|---|
| 5,140,526 | 8/1992 | McDermith et al. | 364/488 |
| 5,311,442 | 5/1994 | Fukushima | 364/488 |
| 5,406,497 | 4/1995 | Altheimer et al. | 364/489 |
| 5,432,708 | 7/1995 | Mohsen | 364/490 |
| 5,448,493 | 9/1995 | Topolewski et al. | 364/488 |
| 5,452,227 | 9/1995 | Kelsey et al. | 364/489 |
| 5,491,640 | 2/1996 | Sharma et al. | 364/488 |
| 5,499,192 | 3/1996 | Knapp et al. | 364/489 |
| 5,519,627 | 5/1996 | Mahmood et al. | 364/488 |
| 5,521,835 | 5/1996 | Trimberger | 364/488 |
| 5,526,276 | 6/1996 | Cox et al. | 364/488 |
| 5,544,066 | 8/1996 | Rostoker et al. | 364/489 |
| 5,574,655 | 11/1996 | Knapp et al. | 364/489 |
| 5,594,657 | 1/1997 | Cantone et al. | 364/488 |

*Primary Examiner*—Kevin J. Teska
*Assistant Examiner*—Tyrone V. Walker
*Attorney, Agent, or Firm*—Edel M. Young; Adam H. Tachner

[57] ABSTRACT

For FPGAs and other logic devices using four-input function generators, several combinations of primitive functions are provided for mapping hardware descriptions of logic designs into the FPGAs or logic devices. Automatic tools using this library will reliably produce dense designs when implemented in coarse-grained architectures.

8 Claims, 1 Drawing Sheet

ADD/SUBCONST/FORCE

SUB/FORCECONST

SUBCONST/MUX

SUB/INVERT

2-INPUT ADD/SUB

ADD/SUBCONST/FORCE

ADD/FORCECONST

SUB/FORCECONST

ADDCONST/MUX

SUBCONST/MUX

SUBVAR/MUX

SUB/INVERT

SET OF FUNCTIONS FOR MAPPING INTO CELL BASED INTEGRATED CIRCUITS WITH FIXED NUMBER OF INPUTS

FIELD OF THE INVENTION

The invention relates to programming of cell based integrated circuits, particularly to programming of FPGAs, CPLDs and mask programmed gate arrays to perform a user specified logic function.

BACKGROUND

A popular way to design complex digital circuits is with a hardware description language such as Verilog or VHDL. Another popular way to design complex digital circuits is with schematic diagrams. A circuit designer provides to a computer a textual or schematic description of the circuit, defining the data manipulations to be performed and naming inputs and outputs of each logic function in terms of which other logic functions it connects to. Then a computer program (from Exemplar or Synopsys, for example) reads the description and generates equivalent circuits for carrying out the user's design. A programmable logic device such as a programmable logic array (PLA), complex programmable logic device (CPLD), application specific integrated circuit (ASIC), or field programmable gate array (FPGA) is then programmed to implement the user's circuit. But state of the art tools from such companies as Exemplar or Synopsys don't efficiently map the user's design into the circuit elements of coarse grained lookup table based FPGAs such as the Xilinx XC4000 FPGA.

Typical steps are to translate the user's high level description into a register transfer level description, which looks like a low-level (assembly language) set of statements. Then these statements are mapped into abstract representations of particular elements of the hardware which will implement the circuit. That is, a computer program selects appropriate abstract elements to implement each of the statements. The set of hardware elements represented by the abstract elements typically include multiplexers, adders, and random logic (random logic refers to individual logic elements rather than logic elements which are structured into groups, such as bits of a number. Random logic includes combinatorial functions such as AND). These abstract hardware elements are then translated into hardware primitive elements without optimization between the hardware available and the abstract elements. This works well for fine grained architectures. But for FPGAs, particularly coarse-grained FPGAs such as made by Xilinx, Inc., which include four-input lookup tables, it is desirable to combine the multiplexers and adders to generate elements which fit efficiently into the coarse-grained four-input lookup table structures of the FPGAs.

SUMMARY OF THE INVENTION

The present invention includes a set of primitive units which map well onto corresponding elements of a logic device such as an FPGA, for example an FPGA based on four-input lookup tables. While a simple heuristic using simple elements does the best thing much of the time, the present invention allows synthesis software to implement designs in FPGAs better and faster than was possible when mapping into a typical set of abstract elements which include only elements such as multiplexers, adders, and random logic. (The heuristic needs to take into account specific architectural features of a particular logic device and thus a heuristic for four-input lookup tables does not apply well to other architectures such as PLAs or even to multiplexer-based FPGAs.)

A typical prior art set of primitive elements is:

| FUNCTION | INPUTS | LEFT OVER IN 4-INPUT LUT |
|---|---|---|
| Add | 3 | 1 |
| Add/Sub | 4 | 0 |
| Add constant | 2 | 2 |
| Add/Sub constant | 3 | 1 |
| Force constant | 1 | 3 |
| Mux | 3 | 1 |
| Invert | 1 | 3 |

The number of inputs left over reflects the inefficiency of the prior art mapping algorithms when used with coarse grained cells such as 4-input function generators. (The term function generator as used here includes lookup tables such as employed in Xilinx FPGAs and other coarse grained cells sometimes used in mask programmed gate arrays or antifuse based FPGAs.) In one embodiment, the present invention adds the following combinations of functions to the library of primitive elements:

| FUNCTION COMBO | INPUTS | LEFT OVER IN 4-INPUT LUT |
|---|---|---|
| Add/Sub | 4 | 0 |
| Add and force const. | 4 | 0 |
| Sub and force const. | 4 | 0 |
| Add const and Mux | 4 | 0 |
| Sub const and Mux | 4 | 0 |
| Add/Sub const and force | 4 | 0 |
| Sub and invert | 4 | 0 |

The strategy for allocating particular functions of the user's design to groups to form the above functions is to examine sources which supply each register, and map the source functions to one of the above combinations of functions if possible.

DETAILED DESCRIPTION OF THE DRAWINGS

Figure 1:
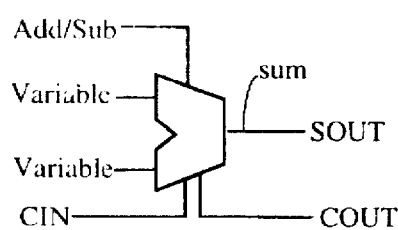
FIGS. 1–8 show eight combinations of functions which are formed where possible when implementing hardware description logic designs in FPGAs which use four-input lookup tables, according to a preferred embodiment of the invention.

FIG. 1 shows the same four-input combination in which two variables may be added or subtracted as determined by the Add/Sub control signal and the sum and carry output signals generated. This function is efficiently performed in an FPGA using four-input lookup tables because a lookup table can implement any four-input function and the Add/Sub function uses four inputs. The four inputs are the two variables to be added, the carry-in signal from a lower order bit, and a control bit which selects whether the function will be addition or subtraction. Two output signals are generated, a sum signal, which is stored in a related register, usually in the same logic block as the four-input lookup table, and a carry-out signal. Some FPGAs, for example the Xilinx XC4000 family products, include hardware which can generate the carry output in the same logic block that generates the sum. Other FPGAs, for example the Xilinx XC3000 family products, do not include such dedicated hardware, and in these products the carry-out signal is generated in a separate logic block, thus requiring two logic blocks to perform the function illustrated in FIG. 1. This particular function is also commonly available in prior art libraries, and thus is typically implemented efficiently by four-input lookup table FPGAs even when selected by prior art computer programs such as provided by Synopsys and Exemplar.

Figure 2:
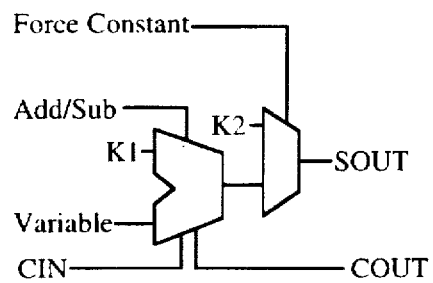

FIG. 2 shows another four-input combination in which a constant K1 is either added to or subtracted from a variable, and either the output of this addition/subtraction or a constant value K2 is supplied to a register as selected by a Force Constant input signal. As illustrated, the four inputs to the lookup table are the variable and carry-in signals to the adder, the Add/Sub control signal that selects between adding and subtracting, and the multiplexer control signal that selects between the sum/difference and the predetermined constant K2.

Figure 3:
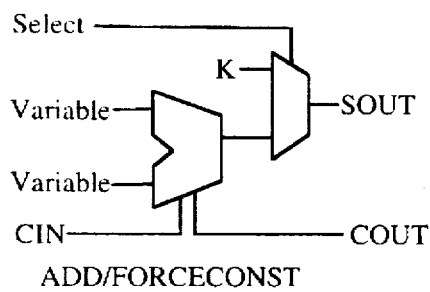

FIG. 3 shows a commonly used combination of functions that uses a combined total of four input signals. This commonly used combination generates as the SOUT signal either the output of an addition or some predetermined constant, often logical 1. The four input signals are the two variables to be added, the carry-in signal CIN, and a selector signal that selects between the addition and the predetermined constant. In this figure, the symbol K refers to a constant, either 0 or 1, known to the user, that can be programmed into the lookup table without requiring an input signal. Grouping the functions into a unit to be handled in a single four-input lookup table makes efficient use of the four-input lookup table. Again, some FPGAs can generate the carry-out signal COUT without requiring a separate lookup table while others generate the COUT signal in a separate lookup table.

Figure 4:
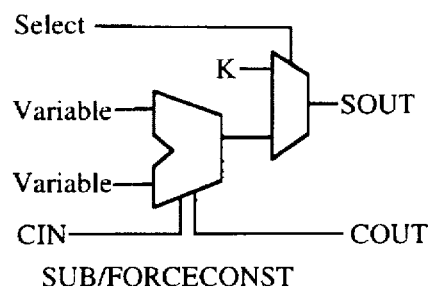

Similarly, FIG. 4 shows the corresponding function which generates as the SOUT signal either the output of a subtraction or a predetermined constant.

Figure 5:
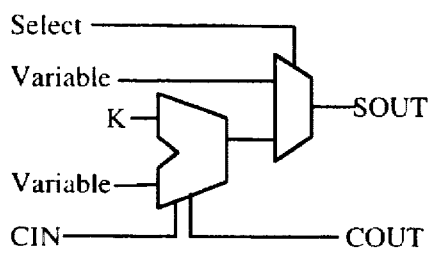

FIG. 5 shows a similar adder-mux combination, in which a constant is to be added to a variable and either the sum or another variable is provided as the SOUT signal. Here, the four inputs are the variable to be added to the constant, the carry-in signal CIN from the less significant bit, the variable to be forwarded, and the select bit that selects between forwarding the sum and alternatively forwarding the variable as the SOUT signal.

Figure 6:
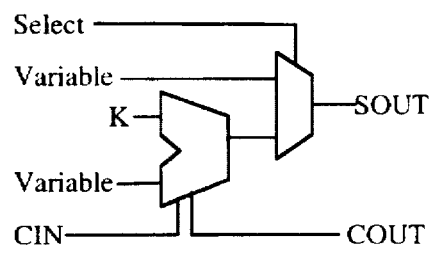
Figure 7:
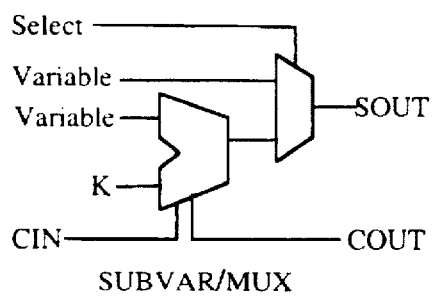

Similarly, FIG. 6 shows the corresponding function for subtracting a constant from a variable and FIG. 7 shows the corresponding function for subtracting a variable from a constant.

Figure 8:
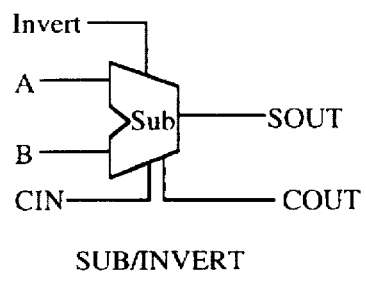

FIG. 8 shows a two's complement subtractor in which the two input signals can be swapped under control of the Invert signal (equivalent to inverting the sign of the output). The four inputs are the carry-in signal CIN, the A and B input signals, and the Invert control signal (which selects whether A and B are swapped before subtraction). The result of the subtraction is supplied as the SOUT signal and the carry-out signal COUT is supplied as the carry-in signal to the more significant bit. As before, the COUT signal may be determined by dedicated hardware in some logic devices and be a separate lookup table in other devices.

In one embodiment, these eight functions, each of which have four inputs, are used where possible by a mapping algorithm before the mapping algorithm selects other functions that map less efficiently into the four-input lookup tables of an FPGA.

To program an FPGA according to the invention, the following steps may be performed:

Providing a description of a user's logic design as a plurality of register transfer level hardware description language statements.

Converting the description from the relatively high-level hardware description language statements into a set of primitive register transfer statements and registers (if registers are used). (The registers need not be bound to hardware and the number of registers need not have been preselected.)

For each of the registers, examining each register transfer statement that provides a register input to determine logic functions that can be grouped according to the set of preferred groupings.

Grouping the register transfer statements according to the preferred groupings.

Selecting a set of preferred groupings for mapping some of the logic into the FPGA.

Finally, other functions are selected from the original primitive library such that all statements are mapped into the FPGA. By mapping the efficient combinations first, the density of logic implemented by the FPGA is increased and the total number of lookup tables used is reduced.

From the above description, other combinations of library elements having a total of four inputs will become obvious to those skilled in the art. Additionally, although the eight elements shown in FIGS. 1–8 all use four inputs, combinations that use only three (or even two) inputs can also be added to the library to improve efficiency over the more primitive elements of the prior art. Further, although much of the above description relates to FPGAs having four-input lookup tables, other combinations can be derived for five-input lookup table FPGAs or three-input lookup table FPGAs, and appropriate combinations can also be derived for FPGAs that implement logic using other hardware than lookup tables, and although much of the above description relates to FPGAs, the invention works as well in other architectures such as coarse grained mask programmed gate arrays. The important feature is to provide combinations that closely match the capabilities of the particular logic device, and that occur frequently enough to be included in the library.

I claim:

1. A set of library elements for implementing logic in a four-input look-up table comprising:

a plurality of library elements each of which receives four inputs and generates a carry output and a second output which is programmably a sum output;

in which said plurality of library elements comprises:

(1) add or subtract a constant to a variable multiplexed with the operation of storing a constant;

(2) add two variables multiplexed with the operation of storing a constant;

(3) subtract one variable from another multiplexed with the operation of storing a constant;

(4) add a constant to a variable multiplexed with the operation of storing another variable;

(5) subtract a constant from a variable multiplexed with the operation of storing a constant;

(6) subtract a variable from a constant multiplexed with the operation of storing a constant; and (7) subtract two variables and select whether the result is inverted.

2. A set of library elements for implementing logic in a four-input look-up table comprising:

a plurality of library elements each of which receives four inputs and generates a carry output and a second output which is programmably a sum output;

wherein one of said library elements comprises:

add or subtract a constant to a variable multiplexed with the operation of storing a constant.

3. A set of library elements for implementing logic in a four-input look-up table comprising:

a plurality of library elements each of which receives four inputs and generates a carry output and a second output which is programmably a sum output;

wherein one of said library elements comprises:

add two variables multiplexed with the operation of storing a constant.

4. A set of library elements for implementing logic in a four-input look-up table comprising:

a plurality of library elements each of which receives four inputs and generates a carry output and a second output which is programmably a sum output;

wherein one of said library elements comprises:

subtract one variable from another multiplexed with the operation of storing a constant.

5. A set of library elements for implementing logic in a four-input look-up table comprising:

a plurality of library elements each of which receives four inputs and generates a carry output and a second output which is programmably a sum output;

wherein one of said library elements comprises:

add a constant to a variable multiplexed with the operation of storing another variable.

6. A set of library elements for implementing logic in a four-input look-up table comprising:

a plurality of library elements each of which receives four inputs and generates a carry output and a second output which is programmably a sum output;

wherein one of said library elements comprises:

subtract a constant from a variable multiplexed with the operation of storing a constant.

7. A set of library elements for implementing logic in a four-input look-up table comprising:

a plurality of library elements each of which receives four inputs and generates a carry output and a second output which is programmably a sum output;

wherein one of said library elements comprises:

subtract a variable from a constant multiplexed with the operation of storing a constant.

8. A set of library elements for implementing logic in a four-input look-up table comprising:

a plurality of library elements each of which receives four inputs and generates a carry output and a second output which is programmably a sum output;

wherein one of said library elements comprises:

subtract two variables and select whether the result is inverted.

* * * * *

UNITED STATES PATENT AND TRADEMARK OFFICE
CERTIFICATE OF CORRECTION

PATENT NO.   : 5,734,866
DATED        : March 31, 1998
INVENTOR(S)  : JACK E. GREENBAUM It is certified that error appears in the above-identified patent and that said Letters Patent is hereby corrected as shown below:

On the title page, insert item [73] Assignee should read:

Xilinx, Inc., San Jose, CA

Signed and Sealed this

Fifth Day of September, 2000

Attest:

Q. TODD DICKINSON

*Attesting Officer*      *Director of Patents and Trademarks*